(12) United States Patent
Hagerup

(10) Patent No.: US 6,373,348 B1
(45) Date of Patent: Apr. 16, 2002

(54) HIGH SPEED DIFFERENTIAL ATTENUATOR USING A LOW TEMPERATURE CO-FIRED CERAMIC SUBSTRATE

(75) Inventor: William A. Hagerup, Portland, OR (US)

(73) Assignee: Tektronix, Inc., Beaverton, OR (US)

( * ) Notice: Subject to any disclaimer, the term of this patent is extended or adjusted under 35 U.S.C. 154(b) by 0 days.

(21) Appl. No.: 09/637,173

(22) Filed: Aug. 11, 2000

(51) Int. Cl.[7] ............................................. H03H 11/24
(52) U.S. Cl. ...................... 333/81 A; 333/172; 330/144
(58) Field of Search ........................... 333/81 R, 81 A, 333/172; 330/144, 69

(56) References Cited

U.S. PATENT DOCUMENTS

| | | | |
|---|---|---|---|
| 5,202,752 A | * 4/1993 | Honjo | 333/81 A |
| 5,218,322 A | 6/1993 | Allison et al. | 330/286 |
| 5,386,339 A | 1/1995 | Polinski et al. | 361/719 |
| 5,604,673 A | 2/1997 | Washburn et al. | 363/147 |

* cited by examiner

Primary Examiner—Robert Pascal
Assistant Examiner—Stephen E. Jones
(74) Attorney, Agent, or Firm—William K. Bucher

(57) ABSTRACT

A high speed differential attenuator is formed on low temperature co-fired ceramic substrate structure having first and second parallel resistor-capacitor divider networks with each divider network having first and second parallel resistors and capacitors. The substrate has first and second dielectric layers with the top surface of the first dielectric layer having a voltage potential lead formed thereon for receiving an integrated circuit device. Each divider network further has first and second conductive elements formed on the top surface of the first dielectric layer functioning as first capacitive plates for the first and second capacitors. A third conductive element is disposed between the first and second dielectric layers and positioned beneath the first conductive element functioning as the other capacitive plate for the first capacitor. A fourth conductive element is disposed between the first and second dielectric layers and positioned beneath both of the second conductive elements of the divider networks and the voltage potential lead and functions as the other capacitive plate for the second capacitors of the divider networks and as a heat transfer layer. At least a first thermally conductive via is formed between the top and bottom surfaces of the second dielectric layer and below the voltage potential lead with the via thermally coupled to the fourth conductive element. The thermal via or vias may be thermally coupled to a heat sink disposed adjacent to the bottom surface of the second dielectric layer.

23 Claims, 2 Drawing Sheets

HIGH SPEED DIFFERENTIAL ATTENUATOR USING A LOW TEMPERATURE CO-FIRED CERAMIC SUBSTRATE

BACKGROUND OF THE INVENTION

The present invention related generally to differential attenuators and more specifically to a high speed differential attenuator formed on a low temperature co-fired ceramic substrate having a dual use buried layer.

Various type of dielectric materials are used for forming substrates for electronic applications. One common substrate material used for hybrid electronic circuits is an alumina ceramic material having conventional thick or thin film resistors and metallization formed on the top surface of the substrate. Alumina ceramic substrates have the advantage of being thermally conductive, which aids in the dissipation of heat generated by integrated circuit devices mounted on the substrate.

A typical high speed differential attenuator circuit used in differential probes, oscilloscope inputs or the like, has first and second closely positioned parallel resistor-capacitor divider networks. Each divider network has an input coupled to receive one of the differential input signals from a device under test and a center tapped output coupled to a differential buffer amplifier. The other end of each network is coupled to electrical ground. It is desirable to construct the entire attenuator circuit from a monolithic substrate, with integrated, laser-trimmable capacitors and resistors. This reduces circuit size and improves side to side matching of the attenuator pair. To maintain high bandwidth and small size, the active differential input buffer integrated circuit (IC) is attached to the substrate directly adjacent to the attenuator, and electrically connected to the attenuator with wire bonds or other means. For probes and similar circuits, the substrate is usually completely or partially inside (or near) a metal tube or some other type of electrical shield.

The use of alumina ceramic substrates has a number of drawbacks when used to build high speed differential attenuators. The alumina ceramic substrate is typically a relatively thick piece of material, with conventional thick or thin film resistors and metallization, and no interior layers. The trimmable shunt capacitor is formed using the entire substrate as a dielectric layer which must be fairly thick for structural reasons. Because of capacitive fringing, the trim range of such a capacitor is small in comparison to its total capacitance. This causes designs to have more capacitance than desired, or less trim range than needed for good yield. It is difficult to design an input capacitor using the entire substrate as a dielectric because of the sensitivity of the capacitor to assembly variations which makes it difficult to match the capacitors in each attenuator leg. Even if this can be done, the ratio of the series to shunt capacitance is still affected by changes in substrate thickness and dielectric constant due to fringing. In a more typical case, the input capacitor is formed by other means, such as an add-on surface mounted component or using another layer (such as thick film cross-over dielectric). In this case, there is no inherent tracking of the capacitor ratios.

Another drawback to using alumina ceramic substrates for differential attenuators is the degrading of the attenuators' common mode rejection ratio (CMRR). Because of the large size and high capacitive fringing of attenuators mounted on alumina ceramic substrates, AC CMRR is degraded by even slight changes in the position of the substrate relative to the outside tube, input pins, or other mechanical structures. Also, capacitive coupling between the positive and negative sides of the differential attenuator, or between capacitors and relatively large, high value resistors that are necessary for high DC input impedance, can cause a "hooky" frequency response which degrades both the differential response and the CMRR. This "hooky" behavior cannot be compensated with standard trimmable capacitors or resistors, and places inherent limits on the CMRR.

Low temperature co-fired ceramic (LTCC) material is also used for forming dielectric substrates for electronic applications. The advantage of LTCC material is the ability for form buried components, such as resistors, capacitors, inductors, transformers and the like within the substrate. U.S. Pat. No. 5,604,673 teaches a low temperature co-fired ceramic substrate for power converters. The low temperature co-fired ceramic substrate includes a number of layers with various metallized conductors located on the outer surface and various inner layers of the substrate. A cavity into which an integrated circuit is placed may be formed with or without thermal vias being formed in the substrate immediately beneath the cavity. A heat sink is positioned underneath the substrate that mates with the thermal vias to provide thermal management for the electronic circuit formed on the substrate. Alternatively, the integrated circuit device may be positioned on the top surface of the substrate with thermal vias formed beneath the integrated circuit location. A cavity is formed in the substrate from the opposite side of the substrate that receives a heat sink. The heat sink mates with the thermal vias underneath the integrated circuit device for thermal management. A further alternative is to form an in-situ heat sink in the low temperature co-fired ceramic substrate using high thermal conductivity LTCC tape disposed in a hole formed in the substrate as described in U.S. Pat. No. 5,386,339.

Various strip line components and passive devices are formed in the low temperature co-fired ceramic substrate as required by the particular circuit design. For example, a capacitor may be formed by locating two parallel conductive plate structures adjacent to each other and separated by a low temperature co-fired ceramic layer in between. Conductive vias may be used to connect the plates to components on the surface of the substrate on other buried components in the substrate.

A drawback to the above described co-fired ceramic structures is providing the proper voltages to the integrated circuit device while providing thermal management of heat generated by the device. Generally, surface mounted IC devices have their bottom surface acting as a voltage input lead. The prior art teaches coupling this lead to a ground potential through the heat sink and vias. However, in high speed differential attenuator applications for differential input probes the voltage input lead on the bottom of the differential buffer amplifier is set at some voltage level, such as a negative source voltage while the heat sink needs to be set at ground potential. Coupling the heat sink to the voltage potential on the bottom of the integrated circuit device will place the voltage potential on the surface of the probe.

What is needed is a high speed differential attenuator design using a dielectric substrate that reduces the capacitive fringing to improve the trim range of the capacitors in the attenuator and improves the differential response and common mode rejection ratio. The attenuator design should reduce the sensitivity of the attenuator to variations in the substrate thickness and dielectric constant and positioning of the substrate in relation to electrical shield or other mechanical structures. Further, there is a need for an attenuator design using a LTCC substrate structure that allow the bottom surface voltage input leads of an differential buffer amplifier to be coupled to a non-electrical ground voltage supply while providing thermal management of the heat generated by the IC device. Such a design should have a minimal effect on the overall size of the substrate. The attenuator design should also provide flexibility in laying out and connecting various components formed on and in the substrate structure. Further, there is a need to combine elements of the thermal management structure with the component structures for maintaining a minimum size for the substrate.

SUMMARY OF THE INVENTION

Accordingly, the present invention is to a high speed differential attenuator formed on a low temperature co-fired ceramic substrate having first and second dielectric layers with each dielectric layer having top and bottom surfaces. The top surface of the first dielectric layer has a voltage potential lead formed thereon for receiving an integrated circuit device where the bottom surface of the integrated circuit device is a voltage input lead for the integrated circuit device. First and second parallel resistor-capacitor divider networks are formed as part of the substrate with each divider network having first and second parallel resistors and capacitors. Each divider network has an input node and a center tapped output node with each input node coupled to receive an input signal and each output node coupled to an input of the integrated circuit device. Each divider network further has first and second conductive elements formed on the top surface of the first dielectric layer functioning as first capacitive plates for the first and second capacitors. A third conductive element is disposed between the first and second dielectric layers and positioned beneath the first conductive element of each divider network functioning as the other capacitive plate for the first capacitor. The first and second conductive elements are electrically coupled together by an electrical conductor or as a single plate element. A fourth conductive element is disposed between the first and second dielectric layers and positioned beneath both of the second conductive elements of the divider networks and the voltage potential lead and functions as the other capacitive plates for the second capacitors of the divider networks and as a heat transfer layer. First and second electrically conductive vias are respectively coupled to the input nodes of the divider networks and to the respective third conductive elements. At least a first thermally conductive via is formed between the top and bottom surfaces of the second dielectric layer below the voltage potential lead and thermally coupled to the fourth conductive element disposed between the dielectric layers.

In the preferred embodiment of the invention, the high speed differential attenuator has a plurality of thermally conductive vias formed beneath the voltage potential lead in an array pattern. A heat sink may be disposed adjacent to the bottom surface of the second dielectric layer and thermally coupled to the thermally conductive via or vias. In the preferred embodiment of the invention, a conductive pattern is formed on the bottom surface of the second dielectric layer that is thermally coupled to the thermally conductive via or vias. The heat sink is disposed adjacent to the bottom surface of the second dielectric layer and thermally coupled to the third conductive pattern. The thermally conductive via or vias are preferably cylindrically formed bores filled with a high thermally conductive material, such as gold. It is also preferred that the thermally conductive via or vias be electrically conductive.

The respective divider networks have resistors formed on the top surface of the first dielectric layer using traditional thick or thin film processes. The fourth conductive element disposed between the dielectric layers is coupled to a ground potential and provides a ground node for each of the divider networks. The voltage potential lead is coupled to a negative voltage potential.

The first dielectric layer preferably has a thickness in the range of 0.004 inches and the second dielectric layer has a thickness in the range of 0.025 inches. The conductive patterns have a thickness in the range of 0.0005 inches. Each of the thermally conductive vias in the array have a bore diameter in the range of 0.010 inches and a center to center spacing in the range of 0.020 inches.

The objects, advantages and novel features of the present invention are apparent from the following detailed description when read in conjunction with appended claims and attached drawings.

BRIEF DESCRIPTION OF THE DRAWING FIGURES

DETAILED DESCRIPTION OF THE PREFERRED EMBODIMENT

Figure 1:
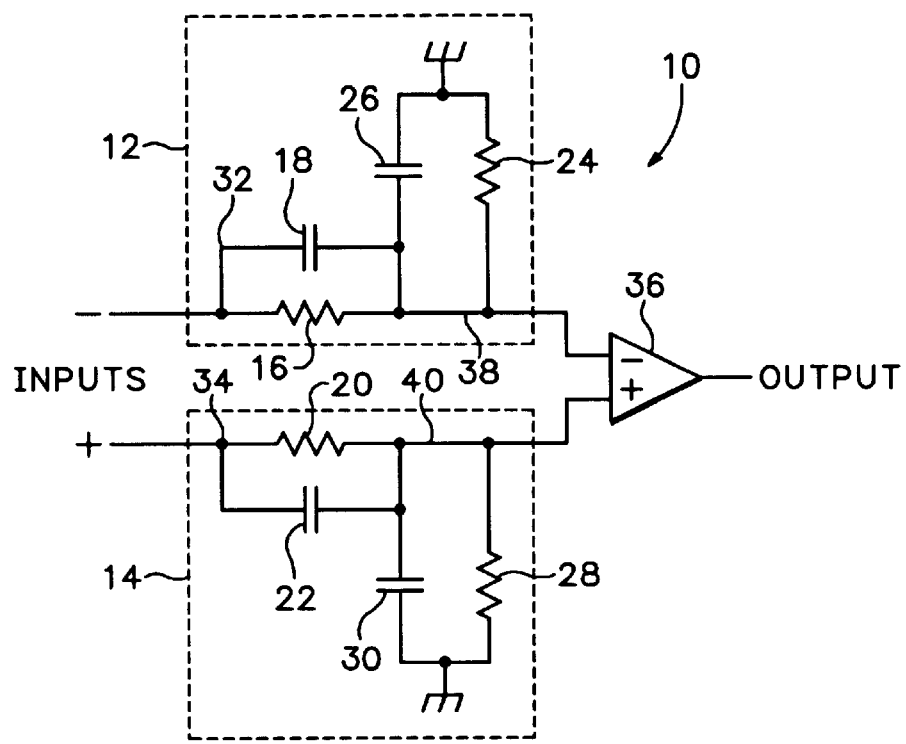
FIG. 1 is a simplified schematic representation of a high speed differential attenuator according to the present invention.

Referring to FIG. 1, there is shown a simplified schematic representation of the high speed differential attenuator 10 implemented in the present invention. The differential attenuator has first and second parallel resistor-capacitor divider networks 12 and 14. Each divider network 12, 14 has a parallel coupled input resistor-capacitor pair 16, 18 and 20, 22 connected in series with parallel coupled a shunt resistor-capacitor pair 24, 26 and 28, 30. Each input resistor-capacitor pair 16, 18 and 20, 22 is coupled to receive one of the differential input signal at respective input nodes 32, 34 and couples the signal to the differential inputs of a differential buffer amplifier 36 via respective center tapped output nodes 38, 40. Each of the shunt resistor-capacitor pair is shown coupled to electrical ground.

Figure 2:
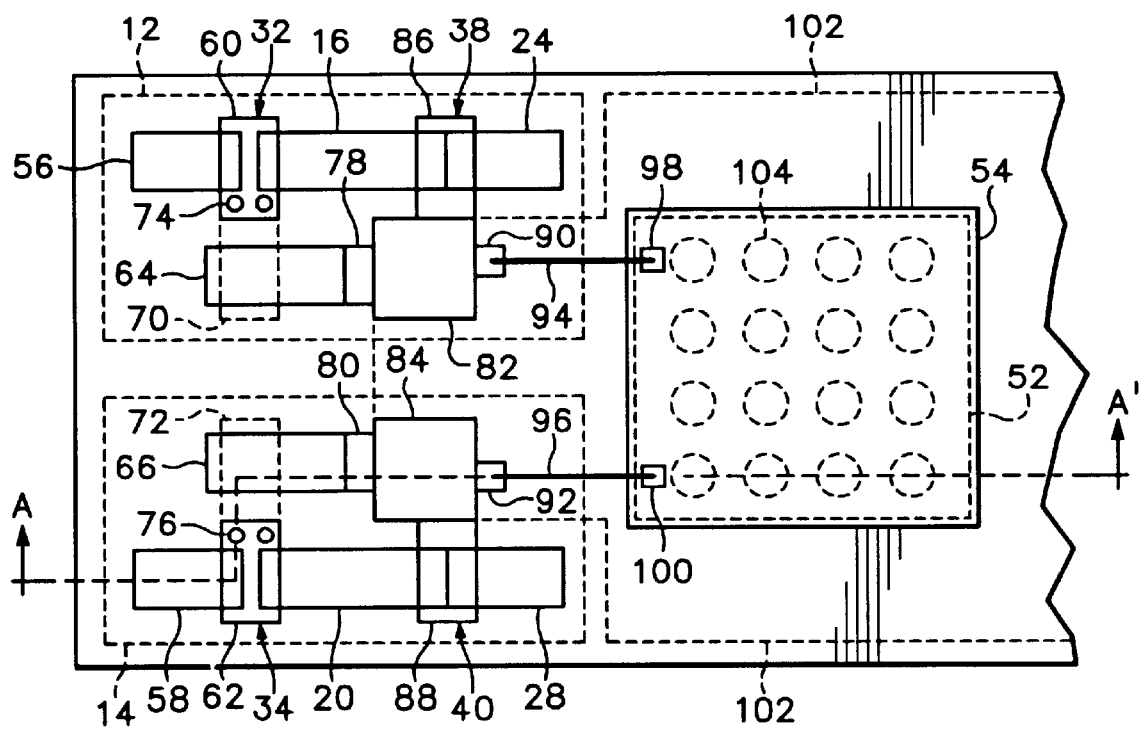
FIG. 2 is a top plane view of the high speed differential attenuator implemented on a low temperature co-fired ceramic substrate according to the present invention.
Figure 3:
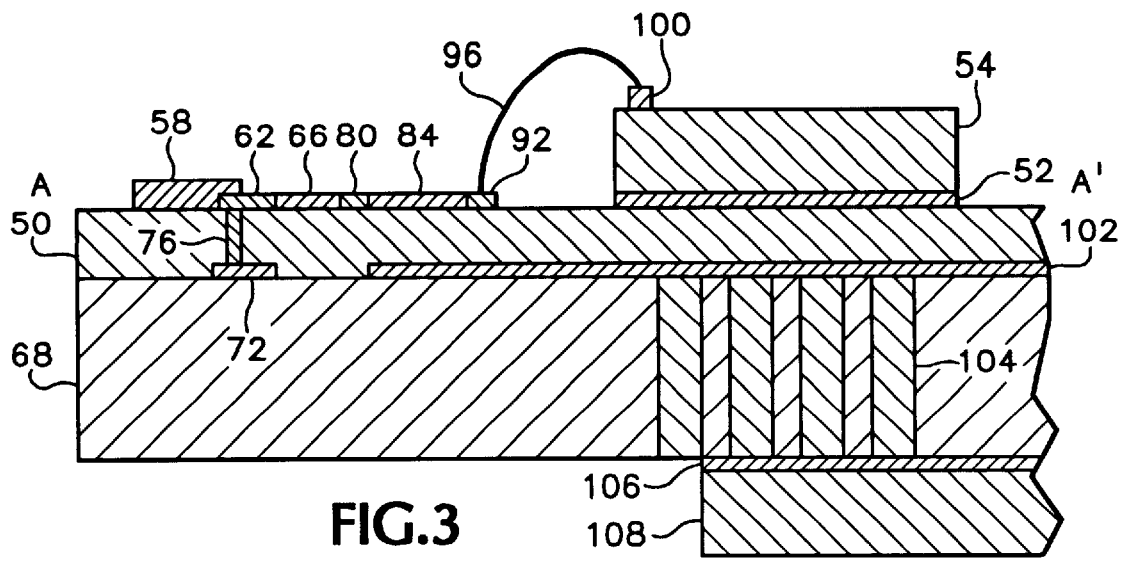
FIG. 3 is a side sectional view along line A—A' of the high speed differential attenuator implemented on a low temperature co-fired ceramic substrate according to the present invention.

Referring to FIG. 2, there is shown a top plan view of the high speed differential attenuator implemented on a low temperature co-fired ceramic (LTCC) substrate according to the present invention. The substrate structure is a multilayer structure formed of individual layers of dielectric LTCC material as best viewed in the side sectional view along line A—A' in FIG. 3. The substrate structure is preferably implemented using Dupont 951 LTCC material but other LTCC material having similar characteristics to the Dupont 951 material may equally be used in the present invention. The substrate structure has a first dielectric layer 50 on which is formed portions of the side-by-side first and second parallel resistor-capacitor divider networks 12 and 14. A voltage potential lead 52 is also formed on the top surface adjacent to the divider networks 12, 14 that receives an integrated circuit device (IC) 54. In the preferred embodiment, the IC device is a differential input buffer amplifier that has a voltage input lead formed on its bottom surface. The divider networks 12, 14 and associated elements are preferably formed using well known thick film processes. Alternately, well known thin film processing may be used.

Input conductors 56 and 58 on the top surface of first dielectric layer 50 couple the respective differential input signals to input resistors 16 and 20 and to input sides of input capacitors 18 and 22 of divider networks 12 and 14 at terminations pads 60 and 62 functioning as respective input nodes 32 and 34. The input capacitors 18 and 22 have respective first conductive elements 64 and 66 formed to the top surface of the first dielectric layer 50 acting as one of the plates for the capacitors. Disposed between the first dielectric layer 50 and a second dielectric layer 68 are respective third conductive elements 70 and 72 acting as the other plates for the capacitors 18 and 22. Electrically conductive vias 74 and 76, of which two are shown for each divider network, are formed in the first dielectric layer 50 for coupling the input signals to the respective plates of the capacitors 18 and 22. The respective first conductive elements 64 and 66 of the input capacitors 18 and 22 on the top surface of the first dielectric layer 50 are electrically coupled via conductors 78 and 80 to respective second conductive elements 82 and 84 functioning as one of the plates for shunt capacitors 26 and 30. Termination pads 86 and 88, functioning as the center tapped output nodes 38 and 40, respectively connect one end of shunt resistors 24 and 28 to the respective second electrically conductive elements 82 and 84 and to the input resistors 16 and 20. The shunt resistors 24 and 28 are coupled to electrical ground via a ground conductor or buried via (not shown). Alternately, the grounded side of the shunt resistors 24 and 28 may be ungrounded and coupled as inputs to the differential buffer amplifier IC 54. The second conductive elements 82 and 84 of shunt capacitors 26 and 30 are respectively coupled to output pads 90 and 92. Wire bonds 94 and 96 connect the center tapped output nodes 38 and 40 to input pads 98 and 100 on differential buffer amplifier IC 54. Alternately, conductive elements 64 and 82 and conductor 78, and conductive elements 66 and 84 and conductor 80 may be formed as single laser trimmable conductive elements. A fourth conductive element 102 is disposed between the first dielectric layer 50 and second dielectric layers 68 that is underneath both conductive elements 82 and 84 and the voltage potential lead 52. The fourth conductive element 102 functions as the other plates for the shunt capacitors 26 and 30 as well as a heat transfer layer to provide thermal management for the heat generated by the IC 54.

In the preferred embodiment, a matrix of thermally conductive vias 104 are formed between the top and bottom surfaces of the second dielectric layer 68 underneath the voltage potential lead 52. The vias 104 are thermally coupled to the fourth conductive element 102 and to a thermally conductive pattern 106 on the bottom surface of the second dielectric substrate 68. A heat sink 108 may be mounted adjacent to the bottom surface of the second dielectric layer 68 and thermally coupled to thermally conductive pattern 106. The vias 104 are preferably cylindrical bores formed in the second dielectric substrate 68 having a diameter in the range of 0.010 inches and a center to center separation of 0.020 inches. The vias are preferably filled with a high thermally conductive material, such as gold. Further, the vias 104, the conductive pattern 106 and the heat sink 108 are preferably electrically conductive. The thick film deposited elements are preferably in the range of 0.0005 inches. The first dielectric layer 50 has a thickness in the range of 0.004 inches and the second dielectric layer 68 has a thickness in the range of 0.025 inches. The thickness of the first dielectric layer 50 is a function of the thermal properties of the dielectric layer material. The thickness of layer 50 should be thin enough to provide the transfer of heat from the IC device 54 to the heat transfer layer 102.

The high speed differential attenuator design of the present invention provides close matching and wide trim range for the capacitance ratios in the attenuator. This is more important than the individual capacitance values. Good matching is achieved by forming the capacitors in each resistor-capacitor divider network from the same thin dielectric and conductive layers. In contrast, the input capacitors of previous designs were formed on the top surface of a monolithic substrate using a thick film crossover dielectric and the shunt capacitors were formed using the thickness of the monolithic substrate as the dielectric layer. Further, the thin dielectric layer used in forming the capacitors in the divider networks reduces capacitive fringing to provide superior common mode rejection ratio and a larger trim range relative to the total capacitance.

Figure 4:
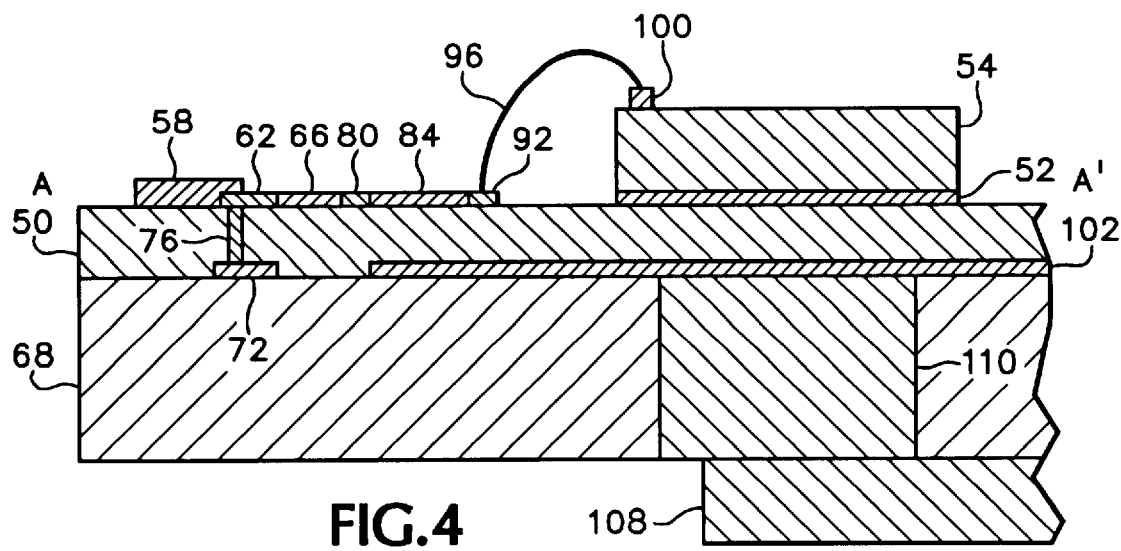
FIG. 4 is a side sectional view along line A—A' of an alternative implementation of the high speed differential attenuator implemented on a low temperature co-fired ceramic substrate according to the present invention.

Referring to FIG. 4, there is shown an alternative embodiment of the differential attenuator design along side sectional line A—A'. Like elements in FIG. 4 are labeled the same as in FIGS. 2 and 3. The relative positions of the conductive elements to each other and their placement in relation to the first and second dielectric layers 50 and 68 are the same as in the previously described figures. Further, the thickness of the respective dielectric layers 50 and 68 and the conductive elements are the same as in the previous described figures. The alternative embodiment has a single thermally conductive via 110 disposed between the top and bottom surfaces of dielectric layer 68. As in the previous described implementation, the via 110 is preferably formed from a high thermally conductive material, such as gold, which is also electrically conductive. The via 110 is thermally coupled to the fourth conductive element 102 and to heat sink 108. The heat sink 108 may be mounted directly onto the bottom of the dielectric layer 68 without the intervening conductive layer 106. The via 110 may also be formed of a nonelectrically conductive material, in which case the fourth conductive layer 102 is coupled to electrical ground via a ground connection on the substrate. The heat sink 108 is then separately coupled to electrical ground.

The high speed differential attenuator 10 of the present invention has been shown using two LTCC dielectric layers with the top surface of the first dielectric layer 50 being the top surface of the substrate. The high speed differential attenuator may equally be used in a LTCC substrate where the first and second dielectric layers 50 and 68 are disposed within a larger stack of LTCC dielectric layers. In such a configuration, the LTCC substrate has a cavity formed in it to receive the integrated circuit device 54. The voltage potential lead 52 is exposed on the interior flat surface of a cavity and the first and second conductive elements of capacitors 18, 22, 24 and 28 are buried under overlying dielectric layers. The third and fourth conductive elements of the capacitors are disposed between the first and second dielectric layers 50 and 68. The second dielectric layer 68 may be formed from multiple individual layers of LTCC material with passive electrical elements, such as resistors, capacitors, inductors and transformers, formed between the layers and the thermally conductive via or vias formed through the layers.

A high speed differential attenuator implemented on a low temperature co-fired ceramic (LTCC) substrate has been described. The differential attenuator uses a thin dielectric layer on top of a second dielectric layer to form the capacitors of the resistor-capacitor divider networks of the attenuator and to provide heat transfer layer for thermal management of heat generated by device on the substrate. Thermally conductive vias are formed between the top and bottom surfaces of the second dielectric layer that are thermally coupled to the heat transfer layer. A heat sink is disposed adjacent to the bottom surface of the second dielectric layer and is thermally coupled to the vias. In the preferred embodiment of the invention, the vias and heat sink are also electrically conductive.

It will be obvious to those having skill in the art that many changes may be made to the details of the above-described embodiments of this invention without departing from the underlying principles thereof. The scope of the present invention should, therefore, be determined only by the following claims.

What is claimed is:

1. A high speed differential attenuator comprising:
   a low temperature co-fired ceramic substrate having first and second dielectric layers with each dielectric layer having top and bottom surfaces;
   a voltage potential lead formed on the top surface of the first dielectric layer for receiving an integrated circuit device where the bottom surface of the integrated circuit device is a voltage input lead for the integrated circuit device;
   first and second parallel resistor-capacitor divider networks formed as part of the substrate with each divider network having first and second parallel resistors and capacitors and an input node and a center tapped output node with each input node coupled to receive an input signal and each output node coupled to an input of the integrated circuit device;
   each divider network having first and second conductive elements formed on the top surface of the first dielectric layer functioning as first capacitive plates for the first and second capacitors and a third conductive element disposed between the first and second dielectric layers and positioned beneath the first conductive element functioning as the other capacitive plate for the first capacitor with the first and second conductive elements being electrically coupled together;
   a fourth conductive element disposed between the first and second dielectric layers and positioned beneath both of the second conductive elements of the divider networks and the voltage potential lead functioning as the other capacitive plate for the second capacitors of the divider networks and as a heat transfer layer;
   first and second electrically conductive vias respectively coupled to the input nodes of the divider networks and to the respective third conductive elements disposed between the dielectric layers; and
   at least a first thermally conductive via formed between the top and bottom surfaces of the second dielectric layer below the voltage potential lead and thermally coupled to the fourth conductive element disposed between the dielectric layers.

2. The high speed differential attenuator as recited in claim 1 wherein the thermally conductive via comprise cylindrically formed bores filled with gold.

3. The high speed differential attenuator as recited in claim 1 further comprising a heat sink disposed adjacent to the bottom surface of the second dielectric layer and thermally coupled to the thermally conductive via.

4. The high speed differential attenuator as recited in claim 3 further comprising a conductive pattern formed on the bottom surface of the second dielectric layer that is thermally coupled to the thermally conductive via.

5. The high speed differential attenuator as recited in claim 4 further comprising a heat sink disposed adjacent to the bottom surface of the second dielectric layer and thermally coupled to the conductive pattern.

6. The high speed differential attenuator as recited in claim 5 wherein the thermally conductive via is electrically conductive.

7. The high speed differential attenuator as recited in claim 1 further comprising a plurality of thermally conductive via formed between the top and bottom surfaces of the second dielectric layer below the voltage potential lead and thermally coupled to the fourth conductive element disposed between the dielectric layers.

8. The high speed differential attenuator as recited in claim 7 wherein the plurality of thermally conductive vias comprise cylindrically formed bores filled with gold.

9. The high speed differential attenuator as recited in claim 8 wherein the plurality of cylindrically formed thermally conductive vias have a diameter in the range of 0.010 inches.

10. The high speed differential attenuator as recited in claim 9 wherein the plurality of thermally conductive vias are formed in a matrix pattern.

11. The high speed differential attenuator as recited in claim 10 wherein the plurality of thermally conductive vias in the matrix pattern have a center to center separation in the range of 0.020 inches.

12. The high speed differential attenuator as recited in claim 11 further comprising a heat sink disposed adjacent to the bottom surface of the second dielectric layer and thermally coupled to the plurality of thermally conductive vias.

13. The high speed differential attenuator as recited in claim 12 wherein the plurality of thermally conductive vias are electrically conductive.

14. The high speed differential attenuator as recited in claim 11 further comprising a conductive pattern formed on the bottom surface of the second dielectric layer that is thermally coupled to the plurality of thermally conductive vias.

15. The high speed differential attenuator as recited in claim 14 further comprising a heat sink disposed adjacent to the bottom surface of the second dielectric layer and thermally coupled to the conductive pattern.

16. The high speed differential attenuator as recited in claim 15 wherein the plurality of thermally conductive vias are electrically conductive.

17. The high speed differential attenuator as recited in claim 1 wherein the resistors of the respective divider networks are formed on the top surface of the first dielectric layer.

18. The high speed differential attenuator as recited in claim 1 wherein each divider network further comprise a ground node.

19. The high speed differential attenuator as recited in claim 1 wherein the voltage potential lead is coupled to a negative voltage potential.

20. The high speed differential attenuator as recited in claim 1 wherein the fourth conductive element disposed between the dielectric layers is coupled to a ground potential.

21. The high speed differential attenuator as recited in claim 1 wherein the first dielectric layer has a thickness in the range of 0.004 inches.

22. The high speed differential attenuator as recited in claim 1 wherein the second dielectric layer has a thickness in the range of 0.025 inches.

23. The high speed differential attenuator as recited in claim 1 wherein the voltage lead and the conductive elements on the top surface of the first dielectric layer and disposed between the dielectric layers have a thickness in the range of 0.0005 inches.

* * * * *